(12) United States Patent
Chen et al.

(10) Patent No.: US 10,804,883 B2
(45) Date of Patent: Oct. 13, 2020

(54) POWER SUPPLY APPARATUS AND MASTER POWER SUPPLY CIRCUIT, SLAVE POWER SUPPLY CIRCUIT AND CONTROL METHOD THEREOF

(71) Applicant: RICHTEK TECHNOLOGY CORPORATION, Zhubei, Hsinchu (TW)

(72) Inventors: Isaac Y. Chen, Hsinchu (TW); Yi-Wei Lee, Taipei (TW)

(73) Assignee: RICHTEK TECHNOLOGY CORPORATION, Zhubei, Hsinchu (TW)

( * ) Notice: Subject to any disclaimer, the term of this patent is extended or adjusted under 35 U.S.C. 154(b) by 0 days.

(21) Appl. No.: 16/599,082

(22) Filed: Oct. 10, 2019

(65) Prior Publication Data
US 2020/0136593 A1 Apr. 30, 2020

(30) Foreign Application Priority Data
Oct. 26, 2018 (CN) .......................... 2018 1 1256102

(51) Int. Cl.
G06F 1/26 (2006.01)
H03K 3/012 (2006.01)
H03K 3/3562 (2006.01)
G06F 13/40 (2006.01)

(52) U.S. Cl.
CPC ............ *H03K 3/012* (2013.01); *G06F 1/263* (2013.01); *G06F 1/266* (2013.01); *G06F 13/4022* (2013.01); *H03K 3/35625* (2013.01)

(58) Field of Classification Search
CPC .................................. G06F 1/26; G06F 1/263
See application file for complete search history.

(56) References Cited

U.S. PATENT DOCUMENTS 6,291,972 B1 * 9/2001 Zhang .................... H02J 7/0018
320/116
9,608,518 B2 * 3/2017 Yin ........................ H02M 3/155
9,864,390 B2 * 1/2018 Yang ........................ G05F 1/625

\* cited by examiner

*Primary Examiner* — Hai L Nguyen
(74) *Attorney, Agent, or Firm* — Tung & Associates

(57) ABSTRACT

A power supply apparatus having multiple output ports includes: a master power supply circuit for supplying a master output power via a master power switch; a slave power supply circuit for supplying a slave output power via a slave power switch; and a shared resistor coupled between a power management node and a reference ground level. The slave sensing circuit outputs the slave sensing current via a slave power management pin, to generate a total power signal at the power management node. The master control circuit senses the total power signal via the master power management pin, to determine an adjustment current. The slave control circuit controls the slave power switch according to a voltage at the slave power management pin, to adjust the slave output power, so that a total power of the master output power and the slave output power does not exceed a predetermined power range.

39 Claims, 11 Drawing Sheets

POWER SUPPLY APPARATUS AND MASTER POWER SUPPLY CIRCUIT, SLAVE POWER SUPPLY CIRCUIT AND CONTROL METHOD THEREOF

CROSS REFERENCE

The present invention claims priority to CN201811256102.4, filed on Oct. 26, 2018.

BACKGROUND OF THE INVENTION

Field of Invention

The present invention relates to a power supply apparatus; particularly, it relates to such power supply apparatus having multiple output ports. The present invention also relates to a master power supply circuit, a slave power supply circuit and a control method for use in the power supply apparatus.

Description of Related Art

Please refer to FIG. 1, which shows a schematic block diagram of a conventional power supply apparatus having multiple output ports. As shown in FIG. 1, the conventional power supply apparatus 1 has multiple output ports VBUS1~VBUSn. The conventional power supply apparatus 1 can be, for example but not limited to, a USB hub or an AC-DC adapter having multiple output ports (i.e., under such circumstance, VIN shown in FIG. 1 represents an AC input voltage) or a DC-DC power adapter (i.e., under such circumstance, VIN shown in FIG. 1 represents a DC input voltage). Each respective output port has its own respective voltage, current and/or power specification(s). For example, the output port VBUS1 can be an output port complying with USB-PD specification, providing an output voltage (e.g., 5V~20V) and an output current which can be adjustable, with an upper limit(s) of its output current and/or power, while, the output ports VBUS2 and VBUS3 can be output ports complying with USB2.0 specification, providing output voltages which are a constant (e.g., 5V), with an upper limit of its current. In addition, the conventional power supply apparatus 1 has an upper limit for its overall output power.

To comply with different respective limits and the overall limit of the output voltage(s), current(s) output power(s), each respective output port will need to coordinate with one another and adaptively adjust its own respective output current upper limit and/or output power upper limit, so that under the different respective limits and the overall limit of the output voltage(s), current(s) output power(s), the conventional power supply can provide maximum output power to a load circuit.

The present invention provides a power supply apparatus having multiple output ports which adopts a master-slave configuration, wherein different respective output currents and/or output powers of the different respective output ports and the overall output current and/or the overall output power of the power supply apparatus can be managed via one single pin by analog signals or mixed signals.

SUMMARY OF THE INVENTION

From one perspective, the present invention provides a power supply apparatus having multiple output ports, comprising: a master power supply circuit, which is configured to operably supply a master output power via a master power switch; at least one slave power supply circuit, which is configured to operably supply a slave output power via a slave power switch; and a shared resistor coupled between a power management node and a reference ground level; wherein the master power supply circuit includes: a master power management pin coupled to the power management node; a master control circuit, which is configured to operably control the master power switch; and a current source adjustment circuit coupled to the master power management pin, wherein the current source adjustment circuit is controlled by the master control circuit; wherein the slave power supply circuit includes: a slave sensing circuit, which is configured to operably sense a slave output current of the slave output power and which is configured to operably generate a slave sensing current according to the slave output current; a slave power management pin coupled to the power management node; and a slave control circuit, which is configured to operably control the slave power switch; wherein the slave sensing circuit is configured to operably output the slave sensing current via the slave power management pin, so as to generate a total power signal at the power management node; wherein the master control circuit is configured to operably sense the total power signal via the master power management pin and is configured to operably determine an adjustment current according to the total power signal, and wherein the master control circuit is configured to operably control the current source adjustment circuit to output the adjustment current via the master power management pin; and wherein the slave control circuit is configured to operably sense a voltage at the slave power management pin and control the slave power switch according to the voltage at the slave power management pin, thereby adjusting the slave output power so that a total power of the master output power and the slave output power does not exceed a predetermined power range.

In one embodiment, the power supply apparatus having multiple output ports further comprises: a master sensing circuit, which is configured to operably sense a master output current of the master output power and which is configured to operably generate a master sensing signal according to the master output current; wherein the master control circuit is further configured to operably determine the adjustment current according to the master sensing signal.

In one embodiment, the slave control circuit is configured to operably adjust the slave output current or a slave current limit level of the slave power switch according to the voltage at the slave power management pin, so that the total power of the master output power and the slave output power does not exceed the predetermined power range.

In one embodiment, the master control circuit is configured to operably adjust the master output current or a master current limit level of the master power switch according to the voltage at the master power management pin, so that the total power of the master output power and the slave output power does not exceed the predetermined power range.

In one embodiment, the master power supply circuit further includes: an at-least-one-bit master analog to digital circuit (ADC), which is configured to operably convert the total power signal to generate an at-least-one-bit digital total signal representing the total power signal, wherein the generated at-least-one-bit digital total signal is supplied to the master control circuit.

In one embodiment, the master sensing circuit is further configured to operably sense a master output voltage of the master output power and is further configured to operably generate the master sensing signal according to a product of the master output current multiplied by the master output voltage.

In one embodiment, the slave sensing circuit is further configured to operably sense a slave output voltage of the slave output power and is further configured to operably generate the slave sensing current according to a product of the slave output current multiplied by the slave output voltage.

In one embodiment, the master control circuit includes a master state machine or a master microcontroller unit, the master state machine or the master microcontroller unit being configured to operably determine the adjustment current and control the current source adjustment circuit to output the adjustment current via the master power management pin; and/or the slave control circuit includes a slave state machine or a slave microcontroller unit, the slave state machine or the slave microcontroller unit being configured to operably adjust the slave output power according to the voltage at the slave power management pin.

In one embodiment, the adjustment current is a positive current or a negative current.

In one embodiment, the power supply apparatus having multiple output ports further comprises at least one priority setting resistor, wherein the at least one priority setting resistor has one end coupled to the slave power management pin of a corresponding one of the at least one slave power supply circuit, and wherein the at least one priority setting resistor has another end coupled to the master power management pin; wherein the at least one priority setting resistor is configured to operably set a relationship between the slave output power of the corresponding slave power supply circuit and the predetermined power range; or wherein the at least one priority setting resistor is configured to operably set a relationship between the slave output power of the corresponding slave power supply circuit and a slave output power of another slave power supply circuit.

In one embodiment, the power supply apparatus having multiple output ports further comprises at least one priority setting capacitor, which is coupled to the slave power management pin of a corresponding one of the at least one slave power supply circuit; wherein the at least one priority setting capacitor is configured to operably set a relationship between the slave output power of the corresponding slave power supply circuit and the predetermined power range; or wherein the at least one priority setting capacitor is configured to operably set a relationship between the slave output power of the corresponding slave power supply circuit and a slave output power of another slave power supply circuit.

In one embodiment, when the voltage at the slave power management pin is greater than a first slave voltage threshold, the slave output current or the slave current limit level is decreased; and/or when the voltage at the slave power management pin is smaller than a second slave voltage threshold, the slave output current or the slave current limit level is increased.

In one embodiment, under a situation where the slave output current or the slave current limit level of the slave power switch has already been decreased to a minimum slave limit level, when the voltage at the slave power management pin is greater than the first slave voltage threshold, the slave power switch is turned OFF.

In one embodiment, when the slave sensing current is greater than a first slave current threshold and when the voltage at the slave power management pin is smaller than a third slave voltage threshold, the shared resistor is determined to be short-circuited and the slave power switch is turned OFF.

In one embodiment, when the voltage at the master power management pin is greater than a first master voltage threshold, the master output current or the master current limit level is decreased; and/or when the voltage at the master power management pin is smaller than a second master voltage threshold, the master output current or the master current limit level is increased.

In one embodiment, under a situation where the master output current or the master current limit level of the master power switch has already been decreased to a minimum master limit level, when the voltage at the master power management pin is greater than the first master voltage threshold, the master power switch is turned OFF.

In one embodiment, the master power management pin, the slave power management pin of the at least one slave power supply circuit and the power management node together form only and solely one single-wire power management interface, wherein the single-wire power management interface is configured to operably perform power management of the master power supply circuit and the at least one slave power supply circuit, to adjust the slave output power and/or adjust the master output power.

From another perspective, the present invention provides a power supply apparatus having multiple output ports, comprising: a master power supply circuit, which is configured to operably supply a master output power via a master power switch; at least one slave power supply circuit, which is configured to operably supply a slave output power via a slave power switch; and a shared resistor coupled between a power management node and a reference ground level; wherein the master power supply circuit includes: a master power management pin coupled to the power management node; a master control circuit, which is configured to operably control the master power switch; and a communication driver circuit coupled to the master power management pin, wherein the communication driver circuit is controlled by the master control circuit; wherein the slave power supply circuit includes: a slave sensing circuit, which is configured to operably sense a slave output current of the slave output power and which is configured to operably generate a slave sensing current according to the slave output current; a slave power management pin coupled to the power management node; and a slave control circuit, which is configured to operably control the slave power switch; wherein the slave sensing circuit is configured to operably output the slave sensing current via the slave power management pin, so as to generate a total power signal at the power management node; wherein the master control circuit is configured to operably sense the total power signal via the master power management pin and is configured to operably control the communication driver circuit to output a digital adjustment command via the master power management pin according to the total power signal; and wherein the slave control circuit is configured to operably receive the digital adjustment command via the slave power management pin, and wherein the slave control circuit is configured to operably control the slave power switch according to the digital adjustment command, to adjust the slave output power, so that a total power of the master output power and the slave output power does not exceed a predetermined power range.

In one embodiment, the slave control circuit is configured to operably adjust the slave output current or a slave current limit level of the slave power switch according to the digital adjustment command, so that the total power of the master output power and the slave output power does not exceed the predetermined power range.

In one embodiment, the master power management pin, the slave power management pin of the at least one slave power supply circuit and the power management node together form only and solely one single-wire power management interface, wherein the single-wire power management interface is configured to operably perform power management of the master power supply circuit and the at least one slave power supply circuit, to adjust the slave output power and/or adjust the master output power; wherein the digital adjustment command complies with a single-wire communication protocol of the single-wire power management interface.

In one embodiment, under a situation where the communication driver circuit does not transmit the digital adjustment command, the communication driver circuit is disconnected from the master power management pin or is floating with respect to the master power management pin.

In one embodiment, the at least one slave power supply circuit further includes a decoder circuit, which is configured to operably receive a voltage at the slave power management pin and decode the digital adjustment command.

From yet another perspective, the present invention provides a master power supply circuit for use in a power supply apparatus having multiple output ports, wherein the power supply apparatus having multiple output ports includes: at least one slave power supply circuit, which is configured to operably supply a slave output power via a slave power switch; and a shared resistor coupled between a power management node and a reference ground level; wherein the slave sensing circuit is configured to operably output a slave sensing current via a slave power management pin coupled to the power management node, to generate a total power signal at the power management node, and is configured to operably sense a voltage at the slave power management pin, to adjust the slave output power according to the voltage at the slave power management pin; wherein the master power supply circuit is configured to operably supply a master output power via a master power switch; the master power supply circuit comprising: a master power management pin coupled to the power management node; a master control circuit, which is configured to operably control the master power switch; and a current source adjustment circuit coupled to the master power management pin, wherein the current source adjustment circuit is controlled by the master control circuit; wherein the master control circuit is configured to operably sense the total power signal via the master power management pin and is configured to operably determine an adjustment current according to the total power signal, and wherein the master control circuit is configured to operably control the current source adjustment circuit to output the adjustment current via the master power management pin.

In one embodiment, the master power supply circuit further includes: a master sensing circuit, which is configured to operably sense a master output current of the master output power and which is configured to operably generate a master sensing signal according to the master output current; wherein the master control circuit is further configured to operably determine the adjustment current according to the master sensing signal.

In one embodiment, the master control circuit is configured to operably adjust the master output current or a master current limit level of the master power switch according to the voltage at the master power management pin, so that the total power of the master output power and the slave output power does not exceed the predetermined power range.

In one embodiment, the master power supply circuit further includes: an at-least-one-bit master analog to digital circuit (ADC), which is configured to operably convert the total power signal to generate an at-least-one-bit digital total signal representing the total power signal, wherein the generated at-least-one-bit digital total signal is supplied to the master control circuit.

In one embodiment, the master sensing circuit is further configured to operably sense a master output voltage of the master output power and is further configured to operably generate the master sensing signal according to a product of the master output current multiplied by the master output voltage.

In one embodiment, the adjustment current is a positive current or a negative current.

From still another perspective, the present invention provides a slave power supply circuit for use in a power supply apparatus having multiple output ports, wherein the power supply apparatus having multiple output ports includes: a master power supply circuit, which is configured to operably supply a master output power via a master power switch; and a shared resistor coupled between a power management node and a reference ground level; wherein the master power supply circuit is configured to operably determine an adjustment current and output the adjustment current via a master power management pin coupled to the power management node; a master control circuit; wherein the slave power supply circuit is configured to operably supply a slave output power via a slave power switch; the slave power supply circuit comprising: a slave sensing circuit, which is configured to operably sense a slave output current of the slave output power and which is configured to operably generate a slave sensing current according to the slave output current; a slave power management pin coupled to the power management node; and a slave control circuit, which is configured to operably control the slave power switch; wherein the slave sensing circuit is configured to operably output the slave sensing current via the slave power management pin, so as to generate a total power signal at the power management node, wherein the total power signal is sensed by the master power supply circuit for determining the adjustment current; and wherein the slave control circuit is configured to operably sense a voltage at the slave power management pin, to control the slave power switch, thereby adjusting the slave output power, so that a total power of the master output power and the slave output power does not exceed a predetermined power range.

In one embodiment, the slave control circuit is configured to operably adjust the slave output current or a slave current limit level of the slave power switch according to the voltage at the slave power management pin, so that the total power of the master output power and the slave output power does not exceed the predetermined power range.

In one embodiment, the slave sensing circuit is further configured to operably sense a slave output voltage of the slave output power and is further configured to operably generate the slave sensing current according to a product of the slave output current multiplied by the slave output voltage.

From still another perspective, the present invention provides a control method for controlling a power supply apparatus having multiple output ports, wherein the power supply apparatus having multiple output ports includes: a master power supply circuit, which is configured to operably supply a master output power via a master power switch; at least one slave power supply circuit, which is configured to operably supply a slave output power via a slave power switch; and a shared resistor coupled between a power management node and a reference ground level; wherein the master power supply circuit includes a master power management pin coupled to the power management node; wherein the slave power supply circuit includes a slave power management pin coupled to the power management node; the control method comprising: sensing a slave output current of the slave output power and generating a slave sensing current according to the slave output current; outputting the slave sensing current via the slave power management pin, so as to generate a total power signal at the power management node; determining an adjustment current according to the total power signal and outputting the adjustment current via the master power management pin; and controlling the slave power switch according to a voltage at the slave power management pin, so as to adjust the slave output power, and/or adjusting the master output current or a master current limit level of the master power switch according to the voltage at the master power management pin, so that a total power of the master output power and the slave output power does not exceed a predetermined power range.

In one embodiment, the step for adjusting the slave output power includes: when the voltage at the slave power management pin is greater than a first slave voltage threshold, decreasing the slave output current or the slave current limit level; and/or when the voltage at the slave power management pin is smaller than a second slave voltage threshold, increasing the slave output current or the slave current limit level.

In one embodiment, the step for adjusting the slave output power further includes: under a situation where the slave current limit level has already been decreased to a minimum slave limit level, when the voltage at the slave power management pin is greater than the first slave voltage threshold, turning OFF the slave power switch.

In one embodiment, the step for adjusting the slave output power further includes: under a situation where the slave power switch is OFF, when the voltage at the slave power management pin is smaller than the second slave voltage threshold, turning ON the slave power switch and increasing the slave current limit level of the slave power switch.

In one embodiment, the control method further comprising: when the slave sensing current is greater than a first slave current threshold and when the voltage at the slave power management pin is smaller than a third slave voltage threshold, determining the shared resistor is short-circuited and turning OFF the slave power switch.

In one embodiment, the step for adjusting the master current limit level of the master power switch includes: when the voltage at the master power management pin is greater than a first master voltage threshold, decreasing the master output current or the master current limit level; and/or when the voltage at the master power management pin is smaller than a second master voltage threshold, increasing the master output current or the master current limit level.

In one embodiment, the step for adjusting the master current limit level of the master power switch further includes: under a situation where the master current limit level has already been decreased to a minimum master limit level, when the voltage at the master power management pin is greater than the first master voltage threshold, turning OFF the master power switch.

In one embodiment, the step for adjusting the master current limit level of the master power switch further includes: under a situation where the master power switch is OFF, when the voltage at the master power management pin is smaller than the second master voltage threshold, turning ON the master power switch and increasing the master current limit level of the master power switch.

The objectives, technical details, features, and effects of the present invention will be better understood with regard to the detailed description of the embodiments below.

DESCRIPTION OF THE PREFERRED EMBODIMENTS

The drawings as referred to throughout the description of the present invention are for illustration only, to show the interrelations between the circuits and the signal waveforms, but not drawn according to actual scale of circuit sizes and signal amplitudes and frequencies.

Figure 1:
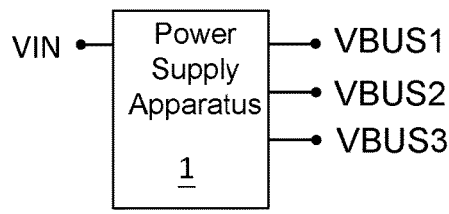
FIG. 1 shows a schematic block diagram of a conventional power supply apparatus having multiple output ports.
Figure 2:
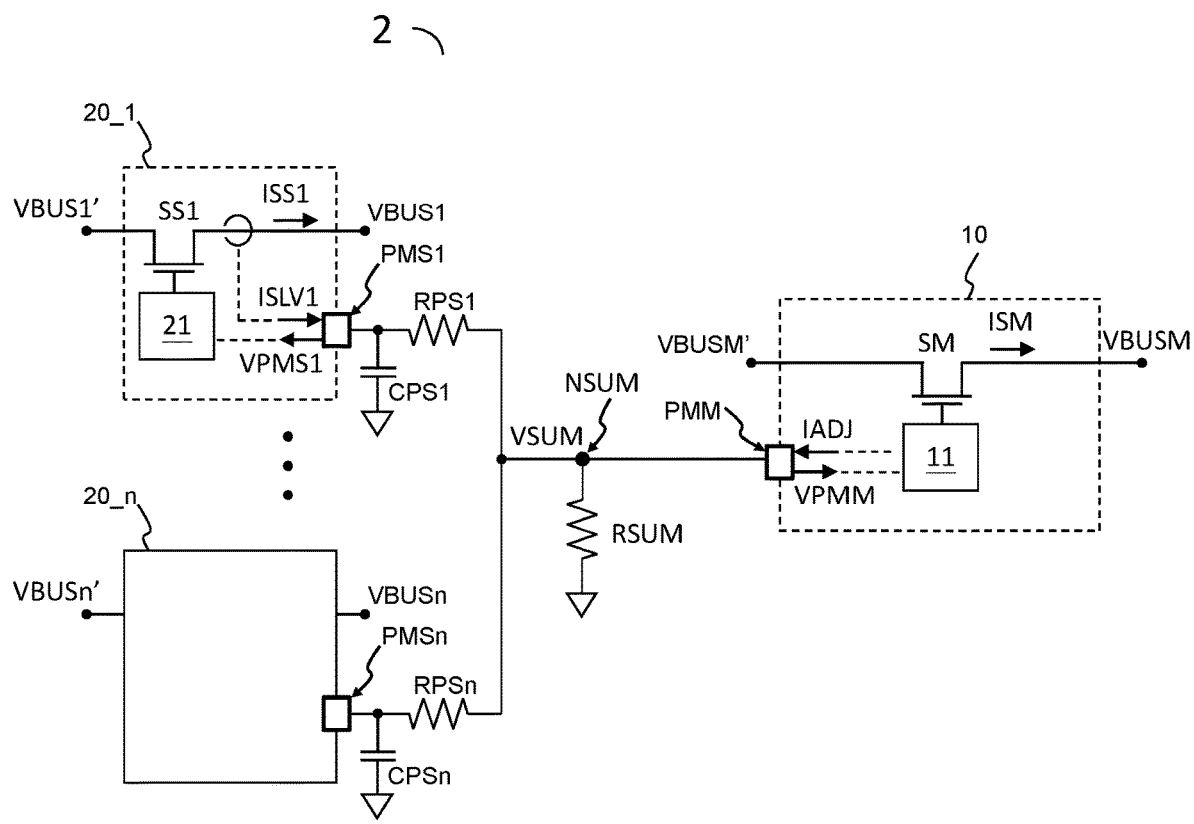
FIG. 2 shows a schematic block diagram of a power supply apparatus having multiple output ports according to an embodiment of the present invention.

Please refer to FIG. 2, which shows a schematic block diagram of a power supply apparatus having multiple output ports (i.e., power supply apparatus 2) according to an embodiment of the present invention. In one embodiment, the power supply apparatus 2 comprises: a master power supply circuit 10, at least one slave power supply circuit (e.g., the slave power supply circuits 20_1~20_n, wherein n denotes a positive integer) and a shared resistor RSUM.

The master power supply circuit 10 is configured to operably supply a master output power via a master power switch SM. In one embodiment, as shown in FIG. 2, the master output power includes a master output current ISM and a master output voltage VBUSM. Each of the at least one slave power supply circuit (e.g., the slave power supply circuits 20_1~20_n) is configured to operably supply a slave output power via a slave power switch (to simplify the description and the drawings, the slave power supply circuit 20_1 is illustrated as an example of the at least one slave power supply circuit, and the corresponding slave power switch is SS1). In one embodiment, as shown in FIG. 2, the slave power supply circuits 20_1~20_n provide corresponding slave output powers, respectively, i.e., slave output current ISS1~ISSn and slave output voltage VBUS1~VBUSn.

In one embodiment, the master power supply circuit 10 is an integrated circuit (IC), and the slave power supply circuits 20_1~20_n are integrated circuits respectively. In one embodiment, the master power supply circuit 10 and the master power switch SM can be integrated into the integrated circuit. In one embodiment, each slave power supply circuit 20_1~20_n and its corresponding slave power switch SS1~SSn can be integrated into a corresponding integrated circuit. For example, the slave power supply circuit 20_1 and the corresponding slave power switch SS1 can be integrated into a corresponding integrated circuit. As shown in FIG. 2, the master power supply circuit 10 is coupled to a master power management node NSUM via a power management pin PMM. Different slave power supply circuits 20_1~20_n are coupled to the master power management pin NSUM via corresponding slave power management pins PMS1~PMSn, respectively.

In one embodiment, the shared resistor RSUM is coupled between a power management node NSUM and a reference level. In one embodiment, preferably, the shared resistor RSUM is coupled between a power management node NSUM and a reference ground level.

From one perspective, in the power supply apparatus 2 of the present invention, the master power management pin PMM, the corresponding slave power management pin (e.g., PMS1~PMSn) of the at least one slave power supply circuit (e.g., 20_1~20_n) and the power management node NSUM together form one and only one single-wire power management interface, for power management between the master power supply circuit 10 and the at least one slave power supply circuit (e.g., 20_1~20_n), to adjust the slave output power and/or adjust the master output power. As one of average skill in the art will readily appreciate, the term "single-wire" refers to: that the master power supply circuit 10 and the at least one slave power supply circuit (e.g., 20_1~20_n) are coupled to a common node (as shown by the power management node NSUM in FIG. 2), and the power supply apparatus 2 can, only and solely via this one power management node NSUM, exchange information and perform power management control by analog signals and/or mixed signals (the details and the features thereof will be described later).

Figure 3A:
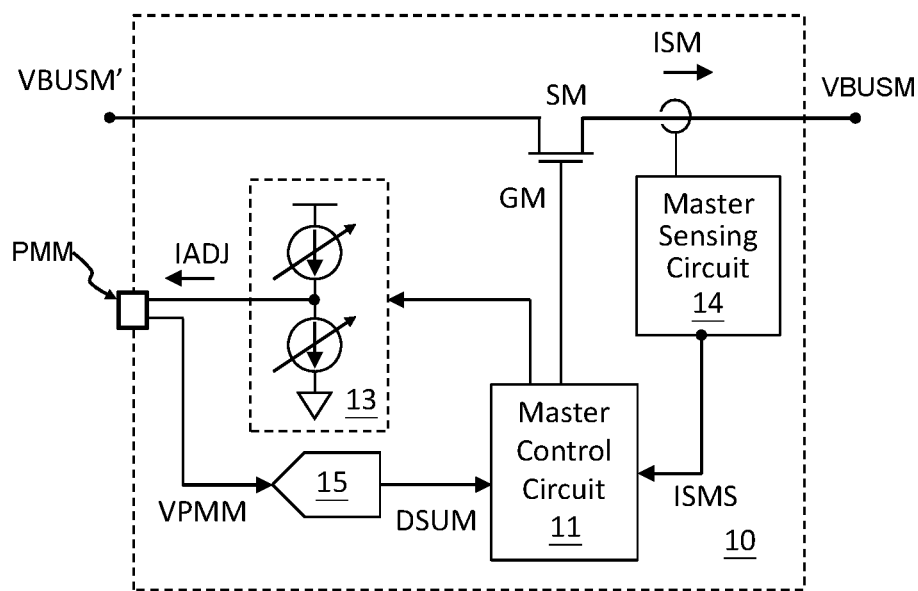
FIG. 3A shows a specific embodiment of a master power supply circuit of the present invention.
Figure 3B:
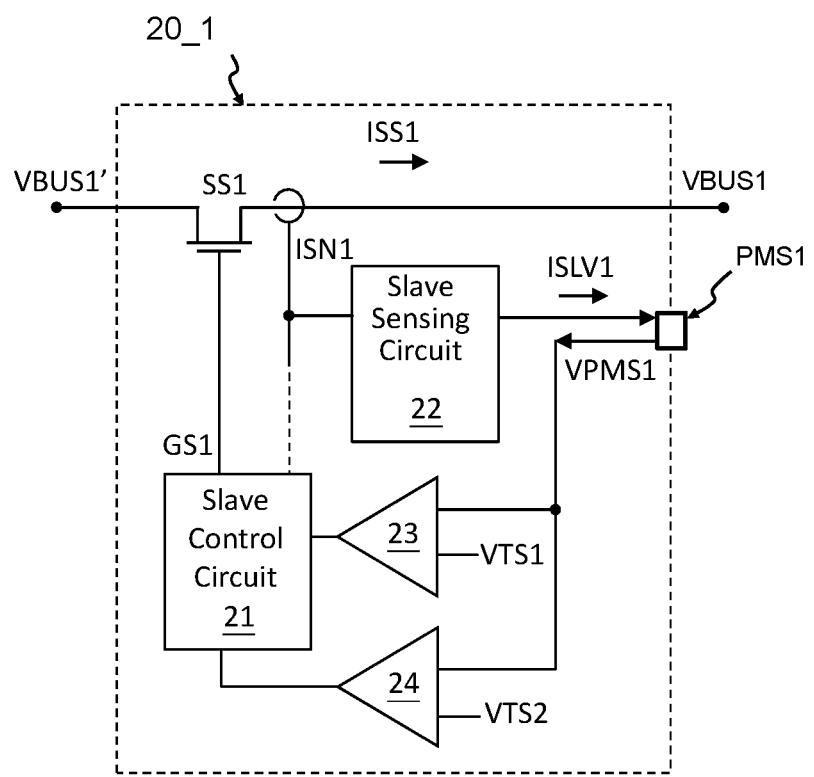
FIG. 3B shows a specific embodiment of a slave power supply circuit of the present invention.

Please refer to FIG. 3A and FIG. 3B. FIG. 3A shows a specific embodiment of a master power supply circuit of the present invention. FIG. 3B shows a specific embodiment of a slave power supply circuit of the present invention. In one embodiment, as shown in FIG. 3A, the master power supply circuit 10 includes: a master power management pin PMM, a master control circuit 11 and a current source adjustment circuit 13. As mentioned above, the master power management pin PMM is coupled to the power management node NSUM. The master control circuit 11 is configured to operably control the master power switch SM. The current source adjustment circuit 13 is coupled to the master power management pin PMM and is under control by the master control circuit 11.

To simplify the description in explaining the concepts of the present invention, the slave power supply circuit 20_1 is taken as an example. In one embodiment, as shown in FIG. 3B, the slave power supply circuit 20_1 includes: a slave sensing circuit 22, a slave power management pin PMS1 and a slave control circuit 21. The slave sensing circuit 22 is configured to operably sense a slave output current ISS1 of the slave output power and is configured to operably generate a slave sensing current ISLV1 according to the slave output current ISS1. As mentioned above, the slave power management pin PMS1 is coupled to the power management node NSUM, and the slave sensing circuit 22 outputs the slave sensing current ISLV1 to the power management node NSUM via the slave power management pin PMS1. The slave control circuit 21 is configured to operably control the slave power switch SS1.

Figure 5A:
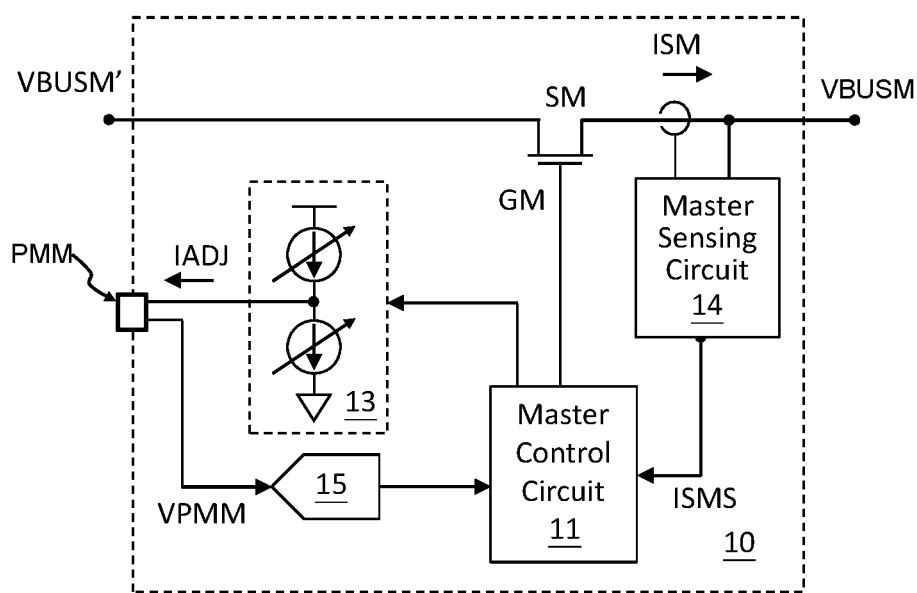
FIG. 5A shows another specific embodiment of a master power supply circuit of the present invention.
Figure 5B:
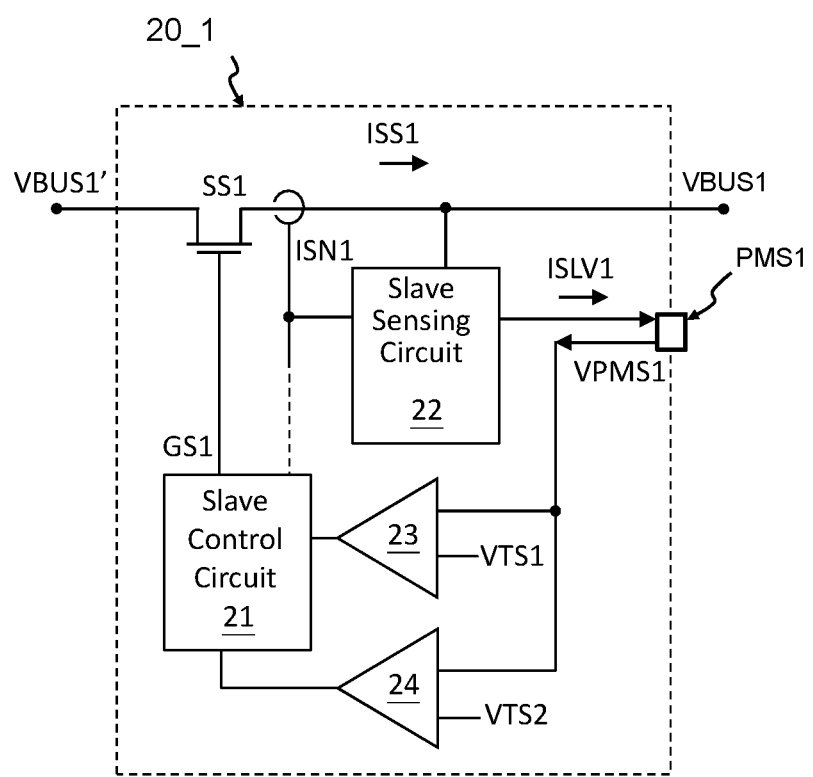
FIG. 5B shows another specific embodiment of a slave power supply circuit of the present invention.

Please refer to FIG. 5B in conjugation with FIG. 3B. FIG. 5B shows another specific embodiment of a slave power supply circuit of the present invention. In one embodiment, the slave sensing circuit 22 is further configured to operably sense a slave output voltage VBUS1 of the slave output power and generate the slave sensing current ISLV1 according to a product of the slave output current ISS1 multiplied by the slave output voltage VBUS1. In other words, the slave sensing current ISLV1 is related to a power of the slave output power in the embodiment of FIG. 5B.

Please refer to FIG. 3B in conjugation with FIG. 2 and FIG. 3A. The slave sensing circuit 22 is configured to operably output the slave sensing current ISLV1 via the slave power management pin PMS1, so as to generate a total power signal VSUM at the power management node NSUM. More specifically, each of the one or more slave power supply circuits can output a corresponding slave sensing current (ISLV1~ISLVn) via a corresponding slave power management pin (PMS1~PMSn in FIG. 2), so as to generate a total power signal VSUM at the power management node NSUM. In other words, the total power signal VSUM at the power management node NSUM comprises the information of all slave sensing currents (ISLV1~ISLVn). It should be noted that the information of all slave sensing currents (ISLV1~ISLVn) corresponds to a sum of all slave output currents (ISS1~ISSn) or a sum of all slave output powers (PSS1~PSSn), which can be represented as a following equation: PSSx=ISSx*VBUSx, wherein x=1~n.

Please still refer to FIG. 2 and FIG. 3A. In the present invention, the master control circuit 11 can obtain the total power signal VSUM via the master power management pin PMM, so as to obtain information related to the sum of all slave output currents (ISS1~ISSn) or the sum of all slave output powers (PSS1~PSSn), whereby the master control circuit 11 can manage power according to the total power signal VSUM. In one embodiment, the master control circuit 11 can obtain information related to the total power signal VSUM via the master power management pin PMM, and determine an adjustment current IADJ according to the total power signal VSUM; the master control circuit 11 controls the current source adjustment circuit 13 to output the adjustment current IADJ via the master power management pin PMM. In one embodiment, as shown in FIG. 3A, the adjustment current IADJ can be a positive current or a negative current. That is, the adjustment current IADJ can be a current flowing into the current source adjustment circuit 13 or a current flowing out from the current source adjustment circuit 13 via the master power management pin PMM.

Please still refer to FIG. 2. The slave control circuit 21 is configured to operably control the slave power switch SS1 according to a voltage VPMS1 at the slave power management pin PMS1, to adjust the slave output power, so that a total power of the master output power and the slave output power does not exceed a predetermined power range. In one embodiment, the slave control circuit 21 is configured to operably control the slave power switch SS1 according to a voltage VPMS1 at the slave power management pin PMS1, so as to adjust the slave output current ISS1 or a slave current limit level OCS1 of the slave power switch SS1, so that the total power of the master output power and the slave output power does not exceed the predetermined power range.

In one embodiment, the voltage VPMS1 at the slave power management pin PMS1 is related to the total power signal VSUM. In one embodiment, the voltage VPMS1 at the slave power management pin PMS1 is equal to the total power signal VSUM, namely, under such circumstance, the slave power management pin PMS1 is directly electrically connected to the power management node NSUM. In one embodiment, one or more other devices can be inserted between the slave power management pin PMS1 and the power management node NSUM; the details will be further explained later.

Because the total power signal VSUM comprises the information related to the sum of all slave output currents (ISS1~ISSn) or the sum of all slave output powers (PSS1~PSSn) and the adjustment current IADJ from the master power supply circuit, the slave control circuit 21 can control the slave power switch SS1 according to the voltage VPMS1 (which is related to the total power signal VSUM) at the slave power management pin PMS1, so as to adjust the slave output power (e.g., adjusting a slave output current ISS1 or a slave current limit level OCS1 of the slave power switch SS1), to ensure that the total power of the master output power and the slave output power does not exceed the predetermined power range.

For example, when the master control circuit 11 senses the total power signal VSUM via the master power management pin PMM, and finds that that the sum of all slave output currents (ISS1~ISSn) or the sum of all slave output powers (PSS1~PSSn) is too large, the master control circuit 11 for example can output a relatively larger adjustment current IADJ, to increase the total power signal VSUM, and the voltage VPMS1 at the slave power management pin PMS1 will be increased accordingly. As a consequence, the slave control circuit 21 can for example decrease the slave output current ISS1 or the slave current limit level OCS1 of the slave power switch SS1 according to the voltage VPMS1 at the slave power management pin PMS1, so that the total power of the master output power and the slave output power can be ensured not to exceed the predetermined power range.

Figure 4A:
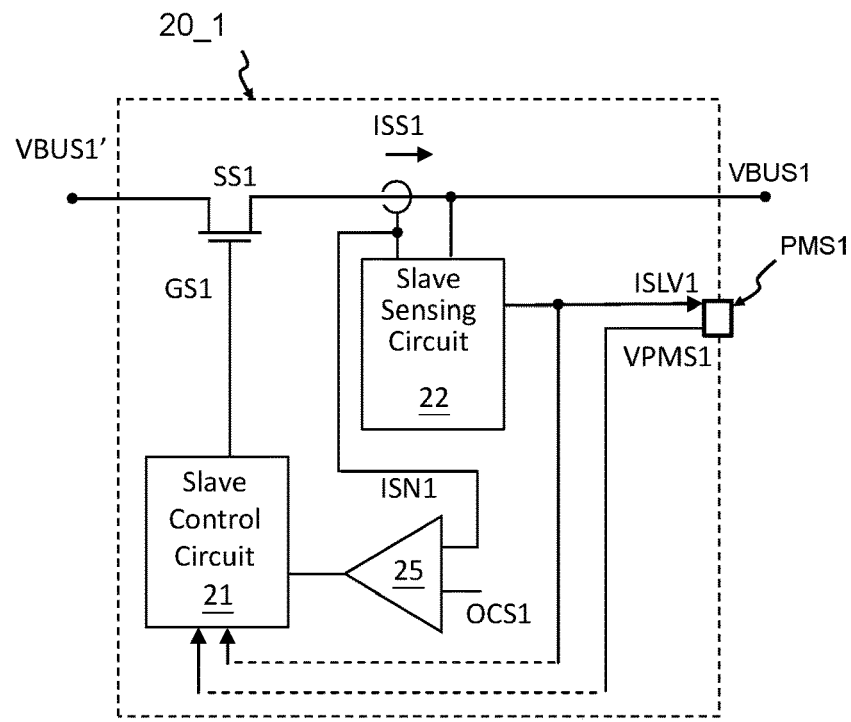
FIGS. 4A-4B show two other specific embodiments of the slave power supply circuit of the present invention.
Figure 4B:
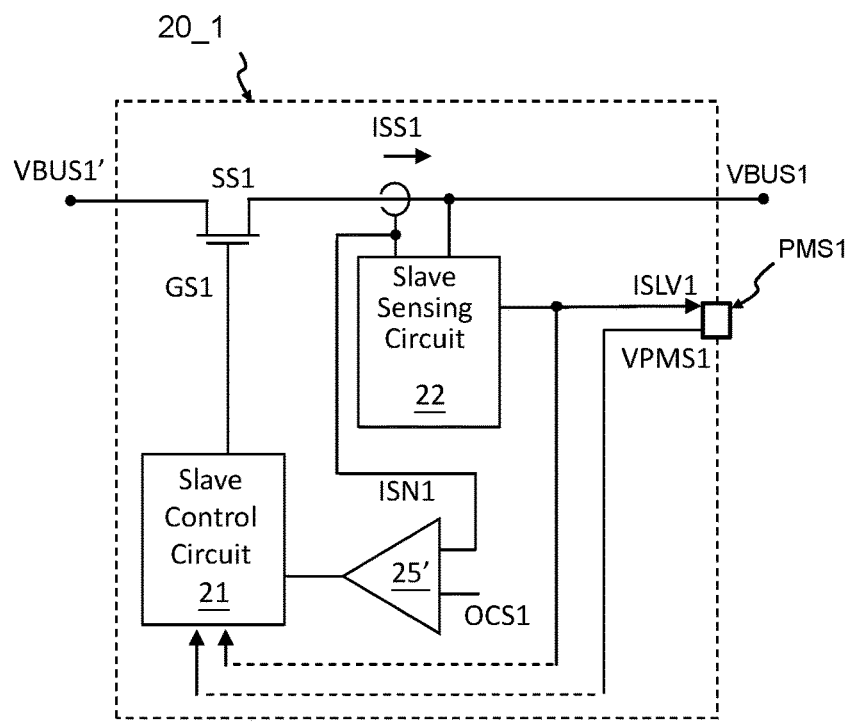

Please refer to FIGS. 4A-4B, which show two other specific embodiments of the slave power supply circuit (only a part of the circuit is shown) of the present invention. In one embodiment, the slave current limit level OCS1 is an over-current protection threshold of the slave power supply circuit 20_1, and as shown in the embodiment of FIG. 4A, the slave power supply circuit 20_1 can include a comparison circuit 25, which is configured to operably compare a slave current signal ISN1 with the slave current limit level OCS1; when the slave output current ISS1 is higher than the over-current protection threshold (i.e., slave current limit level OCS1), the slave power supply circuit 20_1 will enter into a protection mode. Or, in another embodiment, the slave current limit level OCS1 is a clamp current reference, and as shown in FIG. 4B, the slave power supply circuit 20_1 can include an amplifier circuit 25'; the slave control circuit 21 cooperate with the amplifier circuit 25' to control the slave power switch SS1 for example by feedback control, so that the slave output current ISS1 is clamped at (i.e., kept not greater than) the slave current limit level OCS1.

The above-mentioned operations for power control are not limited to being performed in the slave control circuit. In other embodiments, it is also practicable and within the scope of the present invention that the operations for power control can be performed in the master control circuit. Please refer to FIG. 3A. FIG. 3A shows a specific embodiment of a master power supply circuit of the present invention. In one embodiment, as shown in FIG. 3A, the master power supply circuit 10 further comprises a master sensing circuit 14, which is configured to operably sense a master output current ISM of the master output power and generate a master sensing signal ISMS according to the master output current ISM.

Please refer to FIG. 5A. FIG. 5A shows another specific embodiment of a master power supply circuit of the present invention. In this embodiment, the master sensing circuit 14 is further configured to operably sense a master output voltage VBUSM of the master output power and generate the master sensing signal ISMS according to a product of the master output current ISM multiplied by the master output voltage VBUSM. In other words, in this embodiment, the master sensing signal ISMS is related to the power of the master output power.

In one embodiment, as shown in FIG. 3A or FIG. 5A, the master control circuit 11 is configured to operably determine the adjustment current IADJ further according to the master sensing signal ISMS. In other words, in addition to the sum of all slave output currents (ISS1~ISSn) or the sum of all slave output powers (PSS1~PSSn), the master control circuit 11 also takes the master output current ISM or the master output power into consideration, to determine the adjustment current IADJ, so as to control the slave output powers of the slave power supply circuits 20_1~20_n so that the total power of the master output power and the slave output power does not to exceed the predetermined power range.

Note that, in other embodiments, the master control circuit 11 can be designed to determine the adjustment current IADJ without taking the master sensing signal ISMS into consideration. That is, in other embodiments, the master sensing circuit 14 and relevant circuits for generating the master sensing signal ISMS can be omitted.

In one embodiment, the master control circuit 11 is configured to operably control the master power switch SM according to a voltage VPPM at the master power management pin PPM, so as to adjust the master output current ISM or a master current limit level OCM of the master power switch SM, so that the total power of the master output power and the slave output power does not exceed the predetermined power range. In one embodiment, the voltage VPPM at the master power management pin PPM is related to the total power signal VSUM. In one embodiment, the voltage VPPM at the master power management pin PPM is equal to the total power signal VSUM, namely, under such circumstance, the master power management pin PPM is directly electrically connected to the power management node NSUM.

Please refer to FIG. 2. According to the present invention, in one embodiment, the power supply apparatus further comprises at least one priority setting resistor (which are shown by the priority setting resistors RPS1~RPSn in FIG. 2, corresponding to the slave power supply circuits 20_1~20_n, respectively). Taking the slave power supply circuit 20_1 as an illustrative example for simplicity in description, the priority setting resistor RPS1 has one end coupled to the corresponding slave power management pin PMS1 of the corresponding slave power supply circuit 20_1, while the priority setting resistor RPS1 has another end coupled to the master power management pin NSUM. The priority setting resistor RPS1 is configured to operably set a relationship between the slave output power of the slave power supply circuit 20_1 and the predetermined power range, or, to operably set a relationship between the slave output power of the corresponding slave power supply circuit 20_1 and another slave output power of another slave power supply circuit (e.g., the slave power supply circuit 20_2).

Taking the slave power supply circuit 20_1 as an example, when the priority setting resistor RPS1 is set to have a relatively larger resistance, under the same slave sensing current ISLV1, the voltage VPMS1 at the slave power management pin PMS1 will have a relatively higher voltage level, whereby the slave power supply circuit 20_1 will decrease the slave output current ISS1 or the slave current limit level OCS1 of the slave power switch SS1. In other words, in this embodiment, under a situation where the priority setting resistor RPS1 has a relatively larger resistance and under a premise that the total power of the master output power and the slave output power is required not to exceed the predetermined power range, as compared to another slave power supply circuit having its priority setting resistor set to a relatively smaller resistance, a relatively smaller quota of current or power will be allocated to the slave power supply circuit 20_1. On the other hand, when the priority setting resistor RPS1 is set to have a relatively smaller resistance, under a premise that the total power of the master output power and the slave output power is required not to exceed the predetermined power range, a relatively larger quota of current or power will be allocated to the slave power supply circuit 20_1. From another perspective, under a circumstance where multiple slave power supply circuits are provided, different resistances of the priority setting resistors (RPS1~RPSn) of the slave power supply circuits 20_1~20_n determine the priorities of quotas of slave output currents or powers allocated to the corresponding slave power supply circuits. From one perspective, the priority setting resistor sets an upper limit of the slave output power or the slave output current of the corresponding slave power supply circuit; e.g., the priority setting resistor RPS1 sets an upper limit of the slave output power or the slave output current of the corresponding slave power supply circuit 20_1.

Note that, the allocated quotas of slave output currents or powers for different slave power supply circuits can be set by corresponding priority setting resistors by means of a ratio relationship among the resistances of the priority setting resistors, by means of an offset amount of each of the resistances of the priority setting resistors, or by other means.

Besides, for example, under a specific circumstance where the slave output voltages are the same or each is a respective constant, controlling a slave output current or a slave current limit level of a slave power supply circuit is equivalent to controlling a slave output power of that slave power supply circuit.

Please refer to FIG. 2. According to the present invention, in one embodiment, the power supply apparatus further comprises at least one priority setting capacitor CPS1. The priority setting capacitor CPS1 is coupled to the corresponding slave power management pin PMS1 of the corresponding slave power supply circuit 20_1. The priority setting capacitor CPS1 is configured to operably set a relationship between the slave output power of the corresponding slave power supply circuit 20_1 and the predetermined power range. Or, the priority setting capacitor CPS1 is configured to operably set a relationship between the slave output power of the corresponding slave power supply circuit 20_1 and the slave output power of another slave power supply circuit (e.g., the slave power supply circuit 20_2). In this embodiment, the priority setting capacitor CPS1 provide substantially the same function as the above-mentioned priority setting resistor RPS1. That is, the slave sensing current ISLV1 flowing from the slave power management pin PMS1, in cooperation with different capacitances of the priority setting capacitor CPS1, will generate different voltage levels or different voltage increasing/decreasing speeds of the voltage VPMS1 at the slave power management pin PMS1. As a result, via different priority setting capacitors CPS1~CPSn, different slave power supply circuits 20_1~20_n can be set to have different priorities for allocating quotas of slave output currents or powers, especially in transient response.

Please refer to FIG. 3A. In one embodiment, the master power supply circuit 10 further includes an at-least-one-bit master analog to digital circuit (ADC) 15. The ADC 15 is configured to operably convert the total power signal VSUM (via converting the voltage VPPM at the master power management pin PPM), to generate an at-least-one-bit digital total signal DSUM. The generated at-least-one-bit digital total signal DSUM, which represents the total power signal VSUM, is supplied to the master control circuit 11, whereby the master control circuit 11 can perform the above-mentioned determination and control based upon the one-bit digital total signal DSUM.

Figure 6:
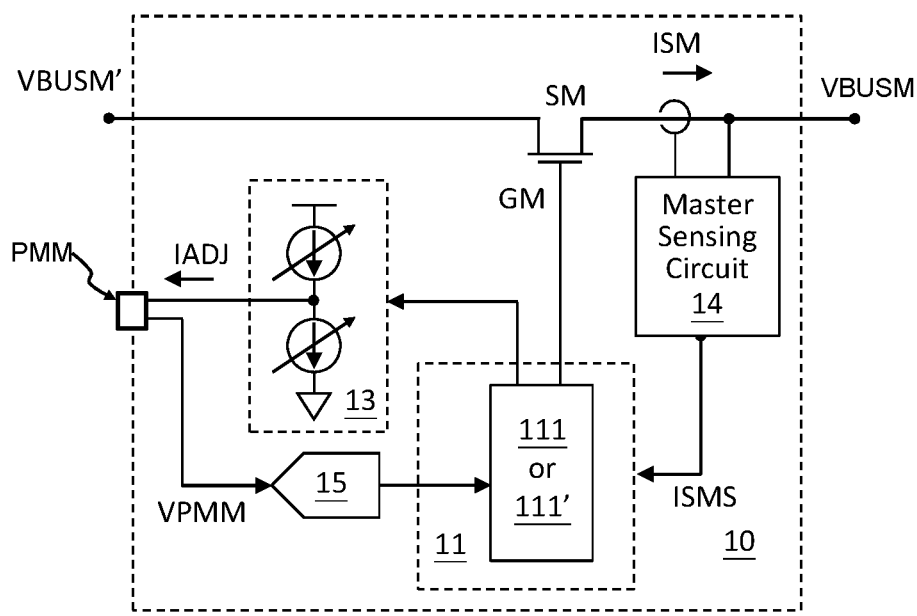
FIG. 6 shows still another specific embodiment of a master power supply circuit of the present invention.

Please refer to FIG. 6, which shows still another specific embodiment of a master power supply circuit (i.e., master power supply circuit 10) of the present invention. In one embodiment, as shown in FIG. 6, the master control circuit 11 includes a master state machine 111 or a master microcontroller unit 111'. In this embodiment, the master state machine 111 or the master microcontroller unit 111' are configured to operably determine the adjustment current IADJ and control the current source adjustment circuit 13 to output the adjustment current IADJ via the master power management pin PMM.

Figure 7:
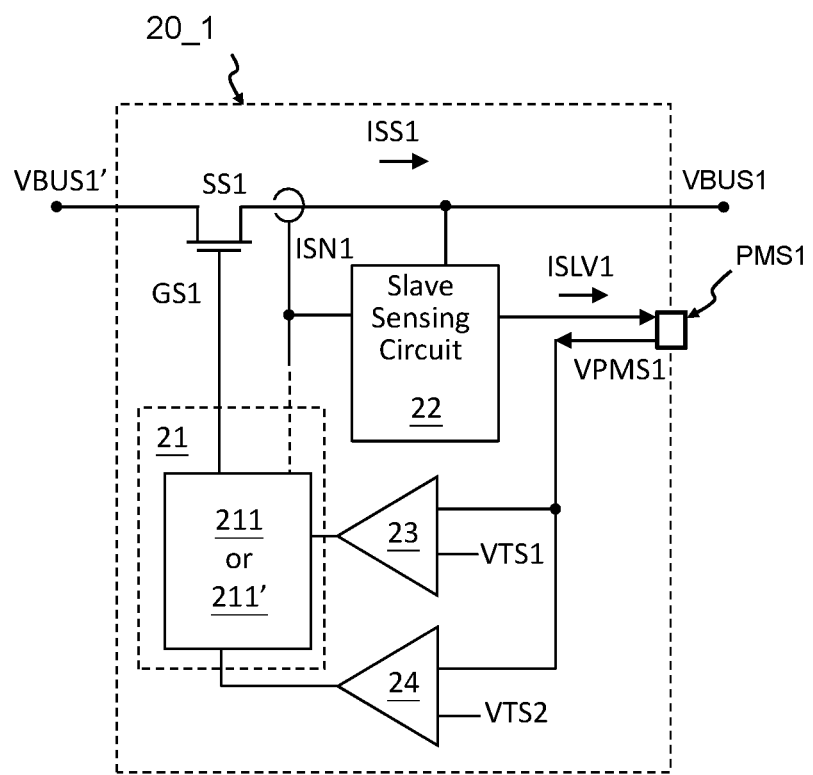
FIG. 7 shows still another specific embodiment of a slave power supply circuit of the present invention.

Please refer to FIG. 7, which shows still another specific embodiment of a slave power supply circuit (i.e., slave power supply circuit 20) of the present invention. In one embodiment, as shown in FIG. 7, the slave control circuit 21 includes a slave state machine 211 or a slave microcontroller unit 211'. In this embodiment, the slave state machine 211 or the slave microcontroller unit 211' are configured to operably adjust the slave output power according to the voltage VPMS1 at the slave power management pin PMS1.

Figure 8A:
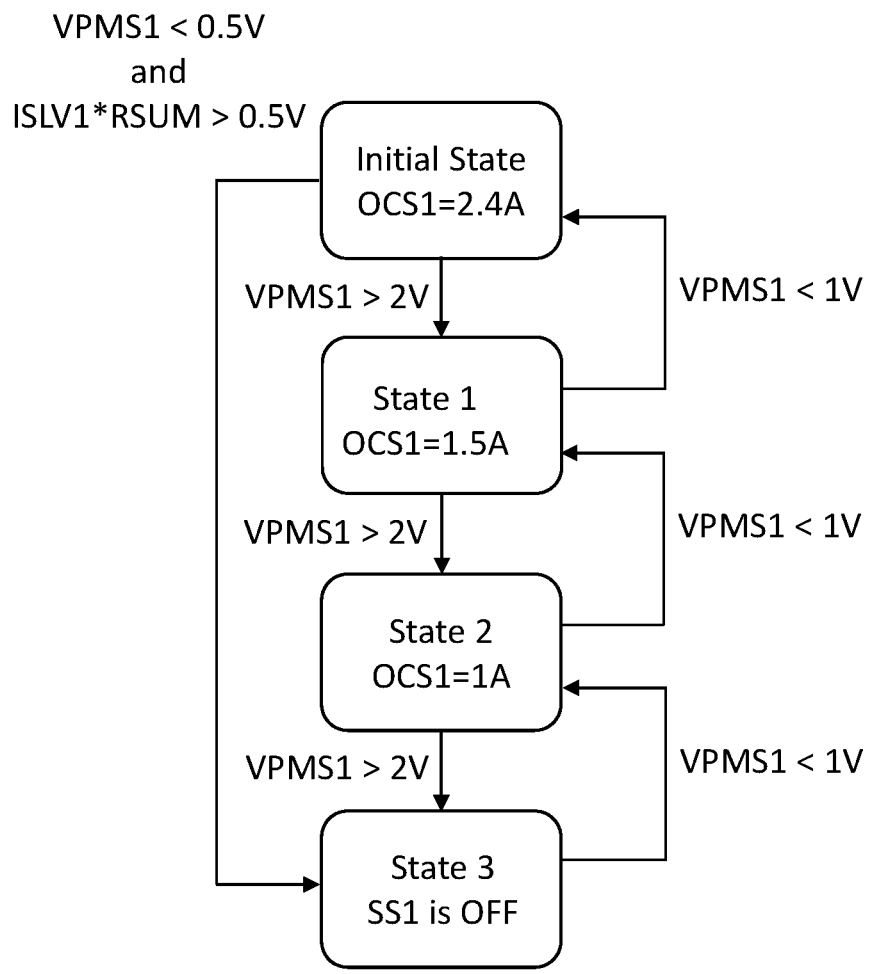
FIG. 8A shows a state diagram corresponding to a slave power supply circuit of the present invention.
Figure 8B:
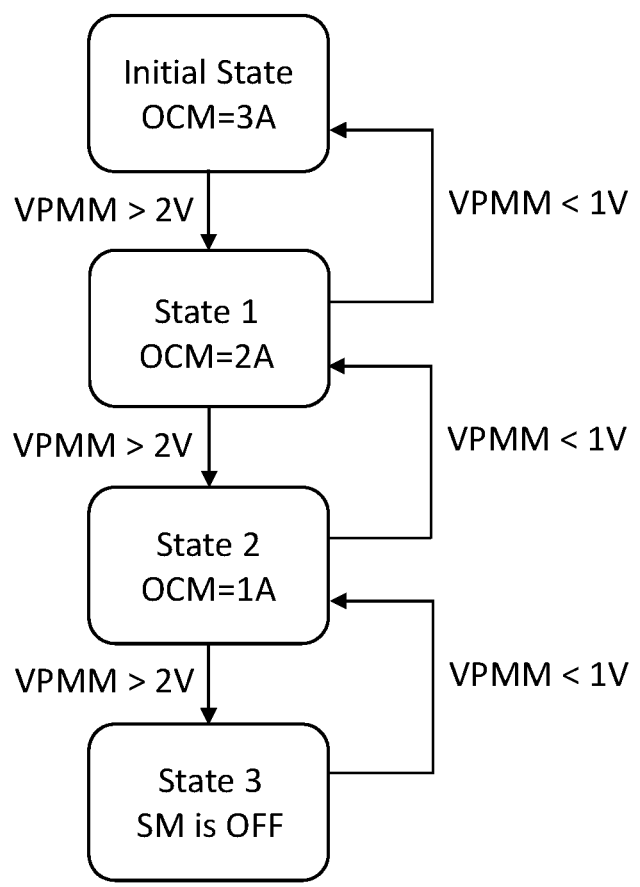
FIG. 8B shows a state diagram corresponding to a master power supply circuit of the present invention.

In one embodiment, the above-mentioned current control or power control (by the master power supply circuit or slave power supply circuit) can be performed in multiple stages. Please refer to FIG. 8A along with FIG. 7. FIG. 8A shows a state diagram corresponding to a slave power supply circuit of the present invention, which is performed for example by the slave state machine 211 or the slave microcontroller unit 211' shown in FIG. 7. In addition, please refer to FIG. 8B along with FIG. 6. FIG. 8B shows a state diagram corresponding to a master power supply circuit of the present invention, which is performed for example by the master state machine 111 or the master microcontroller unit 111' shown in FIG. 6.

In one embodiment, as shown in FIG. 8A, when the voltage VPMS1 at the slave power management pin PMS1 is greater than a first slave voltage threshold VTS1 (for example but not limited to 2V shown in FIG. 8A), the slave output current ISS1 or the slave current limit level OCS1 is decreased. For example, as shown in FIG. 8A, when transiting from initial state to state 1 or when transiting from state 1 to state 2, the slave current limit level OCS1 is decreased (e.g., as shown in FIG. 8A, the slave current limit level OCS1 is gradually decreased from 2.4 A to 1 A), so that the total power of the master output power and the slave output power does not exceed the predetermined power range. Note that, in each of these states, if the voltage VPMS1 at the slave power management pin PMS1 is not greater than the first slave voltage threshold VTS1, it indicates that the total power of the master output power and the slave output power does not exceed the predetermined power range in this state, and under such situation, the slave power supply circuit can stay in this state and supply a slave output power according to the slave current limit level OCS1 of this state.

Please still refer to FIG. 8A, on the other hand, in another embodiment, when the voltage VPMS1 at the slave power management pin PMS1 is smaller than a second slave voltage threshold VTS2 (for example but not limited to 1V shown in FIG. 8A), the slave output current ISS1 or the slave current limit level OCS1 is increased. For example, as shown in FIG. 8A, when transiting from state 2 to state 1 or when transiting from state 1 to initial state, the slave current limit level OCS1 is increased (e.g., as shown in FIG. 8A, the slave current limit level OCS1 is gradually increased from 1 A to 2.4 A). Thus, when the total power of the master output power and the slave output power does not exceed the predetermined power range, the slave power supply circuit can supply slave output power with a maximum affordable current or power. Note that, in each of these states, if the voltage VPMS1 at the slave power management pin PMS1 is not smaller than a second slave voltage threshold VTS2, it indicates that the total power of the master output power and the slave output power may have reached the a maximum power range in this state, and under such situation, the slave power supply circuit can stay in this state and supply a slave output power according to the slave current limit level OCS1 of this state. In one embodiment, the first slave voltage threshold VTS1 is different from the second slave voltage threshold VTS2. In one embodiment, the first slave voltage threshold VTS1 is greater than the second slave voltage threshold VTS2.

Please still refer to FIG. 8A. In one embodiment, under a situation where the slave output current ISS1 or the slave current limit level OCS1 of the slave power switch SS1 has already been decreased to a minimum slave limit level (for example but not limited to 1 A of state 2 shown in FIG. 8A), when the voltage VPMS1 at the slave power management pin PMS1 is greater than the first slave voltage threshold VTS1 (for example but not limited to 2V shown in FIG. 8A), the slave power switch SS1 is turned OFF. That is, under such situation, the slave power supply circuit will enter into state 3 shown in FIG. 8A.

Please still refer to FIG. 8A. In one embodiment, when the slave sensing current ISLV1 is greater than a first slave current threshold ITS1 (corresponding to a situation where the slave output current ISS1 is greater than a second slave current threshold ITS2) and when the voltage VPMS1 at the slave power management pin PMS1 is smaller than a third slave voltage threshold VTS3, the shared resistor RSUM is determined to be short-circuited. In one embodiment, under a situation where the shared resistor RSUM is determined to be short-circuited, the slave power switch SS1 is turned OFF. In one embodiment, the first slave current threshold ITS1 is correlated to the third slave voltage threshold VTS3 and the shared resistor RSUM. For example, as shown in FIG. 8A, the third slave voltage threshold VTS3 can be, for example but not limited to, 0.5V. The resistance of the shared resistor RSUM can be, for example but not limited to, 50K ohm. The first slave current threshold ITS1 can be, for example but not limited to, 10 μampere. In one embodiment, when the slave sensing current ISLV1 is greater than 10 μampere, the voltage VPMS1 (which is equal to ISLV1*RSUM) at the slave power management pin PMS1 is supposed to be greater than the third slave voltage threshold VTS3 (e.g., 0.5V). However, if the voltage VPMS1 at the slave power management pin PMS1 is smaller than the third slave voltage threshold VTS3 (e.g., 0.5V), it indicates that a short-circuit may occur in the shared resistor RSUM. Under such undesirable abnormal situation, the slave power switch SS1 can be turned OFF (as shown by state 3 in FIG. 8A).

In one embodiment, as shown in FIG. 8B, when the voltage VPMM at the master power management pin PMM is greater than a first master voltage threshold VTMH (for example but not limited to 2V shown in FIG. 8B), the master output current ISM or the master current limit level OCM can be decreased. For example, as shown in FIG. 8B, when transiting from initial state to state 1 or when transiting from state 1 to state 2, the master current limit level OCM can be gradually decreased (e.g., as shown in FIG. 8B, the slave current limit level OCS1 is gradually decreased from 3 A to 1 A), so that the total power of the master output power and the slave output power does not exceed the predetermined power range. Note that, in each of these states, if the voltage VPMM at the master power management pin PMM is not greater than the first master voltage threshold VTMH, it indicates that the total power of the master output power and the slave output power does not exceed the predetermined power range in this state. Under such situation, the master power supply circuit can stay in this state and supply a master output power according to the master current limit level OCM of this state.

Please still refer to FIG. 8B, on the other hand, in one embodiment, when the voltage VPMM at the master power management pin PMM is smaller than a second master voltage threshold VTML (for example but not limited to 1V shown in FIG. 8B), the master output current ISM or the master current limit level OCM is increased. For example, as shown in FIG. 8B, when transiting from state 2 to state 1 or when transiting from state 1 to initial state, the master current limit level OCM can be gradually increased (e.g., as shown in FIG. 8B, the master current limit level OCM is gradually increased from 1 A to 3 A). Thus, when the total power of the master output power and the slave output power does not exceed the predetermined power range, the master power supply circuit can supply a master output power with a maximum affordable current or power. Note that, in each of these states, if the voltage VPMM at the master power management pin PMM is not smaller than the second master voltage threshold VTML, it indicates that the total power of the master output power and the slave output power has reached the maximum power range in this state. Under such situation, the master power supply circuit can stay in this state and supply a master output power according to the master current limit level OCM of this state. In one embodiment, the first master voltage threshold VTMH is different from the second master voltage threshold VTML. In one embodiment, the first master voltage threshold VTMH is greater than the second master voltage threshold VTML.

Please still refer to FIG. 8B. In one embodiment, under a situation where the master output current ISM or the master current limit level OCM of the master power switch SM has already been decreased to a minimum master limit level (for example but not limited to 1 A of state 2 shown in FIG. 8B), when the voltage VPMM at the master power management pin PMM is greater than the first master voltage threshold VTMH (for example but not limited to 2V shown in FIG. 8B), the master power switch SM is turned OFF. That is, under such situation, the master power supply circuit will enter into state 3 shown in FIG. 8B.

In the above-mentioned embodiments (e.g., the embodiments shown in FIGS. 3A and 3B), information exchange or power management control are done through analog signals. That is, for example, the slave power supply circuit (e.g., the slave power supply circuit 20_1) outputs a slave sensing current (e.g., the slave sensing current ISLV1) to the power management node NSUM via the slave power management pin (e.g., the slave power management pin PMS1), so that the master power supply circuit 10 can sense the total power signal VSUM at the power management node NSUM via the master power management pin PMM, thereby obtaining information related to the slave output power (e.g., the slave output current ISS1) of the slave power supply circuit (e.g., the slave power supply circuit 20_1). On the other hand, the master control circuit 10 can output the adjustment current IADJ via the master power management pin PPM, so that the slave power supply circuit (e.g., the slave power supply circuit 20_1) can control the slave power switch SS1 according to the adjustment current IADJ and a voltage VPMS1 at the slave power management pin PMS1, to accordingly adjust the slave output current ISS1 or the slave current limit level OCS1 of the slave power switch SS1, so that the total power of the master output power and the slave output power can be ensured not to exceed the predetermined power range. Note that, in one embodiment, the above-mentioned sensing operations (e.g., sensing the master output current and sensing the slave output current) and output operations (e.g., outputting the adjustment current IADJ and outputting the slave output current ISS1) by the master power supply circuit 10 and slave power supply circuit (e.g., the slave power supply circuit 20_1) can be performed simultaneously, or in a time-divided multi-task way.

The above-mentioned embodiments are examples but not the only way to embody the spirit of the present invention. In another embodiment, it is also practicable and within the scope of the present invention that the power supply apparatus can perform operations of information exchange or power management control through mixed signals. Please refer to FIG. 9, which shows a schematic block diagram of a power supply apparatus (i.e., power supply apparatus 9) having multiple output ports according to another embodiment of the present invention. The power supply apparatus 9 of this embodiment is similar to the power supply apparatus 2 of the embodiment shown in FIG. 2, but is different in that: in the power supply apparatus 9 of this embodiment, the master power supply circuit 10' controls power of at least one slave power supply circuit (e.g., 20_1') by a different way. In this embodiment, the master power supply circuit 10' includes a communication driver circuit 16. The communication driver circuit 16 is coupled to the master power management pin PMM and is controlled by the master control circuit 11'. The master control circuit 11' is configured to operably sense the total power signal VSUM (e.g., via a master ADC 15) via the master power management pin PMM, and control the communication driver circuit 16 to output a digital adjustment command via the master power management pin PMM according to the total power signal VSUM. A slave control circuit 21' is configured to operably receive the digital adjustment command via the slave power management pin PMS1, and control the slave power switch SS1 according to the digital adjustment command, to adjust the slave output power so that the total power of the master output power and the slave output power does not exceed a predetermined power range. In one embodiment, the slave power supply circuit 20_1' further includes a decoder circuit 26. The decoder circuit 26 is configured to operably receive the voltage VPMS1 at the slave power management pin PMS1 and decode the above-mentioned digital adjustment command.

In one embodiment, the slave power supply circuit 20_1' still outputs a slave sensing current ISLV1 to the power management node NSUM via the slave power management pin PMS1. The slave sensing current ISLV1 is an analog signal while the digital adjustment command outputted from the master power management pin PMM is a digital signal, so this is what the present invention refers to as "performing control through mixed signals". According to one embodiment of the present invention, a bilateral communication can be achieved through a time-divided multi-task way. That is, on one hand, during a period of time, the slave power supply circuit 20_1' outputs the slave sensing current ISLV1 to the power management node NSUM via the slave power management pin PMS1, so as to deliver information related to the slave output power (in an analog way); while on the other hand, during another period of time, the master power supply circuit 10' outputs the digital adjustment command via the master power management pin PMM (in a digital way). Under such circumstance, in one embodiment, under a situation where the communication driver circuit 16 does not transmit the digital adjustment command, the communication driver circuit 16 is disconnected from the master power management pin PMM or is floating with respect to the master power management pin PMM, so that the communication driver circuit 16 does not affect the operation of the slave power supply circuit 20_1' to output the slave sensing current ISLV1 to the power management node NSUM via the slave power management pin PMS1. Or, according to another embodiment of the present invention, a bilateral communication can be achieved through a multi-band multi-task way. That is, the bilateral communication can be performed at the same time. Under such situation, the communication driver circuit 16 can adopt a predetermined digital coding which has high and low levels that can be differentiated from one the other regardless of the base level, and the high and low levels are predetermined DC levels, so that while the slave power supply circuit 20_1' is delivering information related to the slave output power through an analog way, and the master power supply circuit 10' is concurrently transmitting the digital adjustment command, the digital high and low levels of the digital adjustment command can still be identified, and on the other hand, in reading and interpreting the information related to the slave output power (which is an analog signal), the DC levels in the digital adjustment command can be removed from the analog signal, to obtain an accurate total power signal VSUM.

Figure 9:
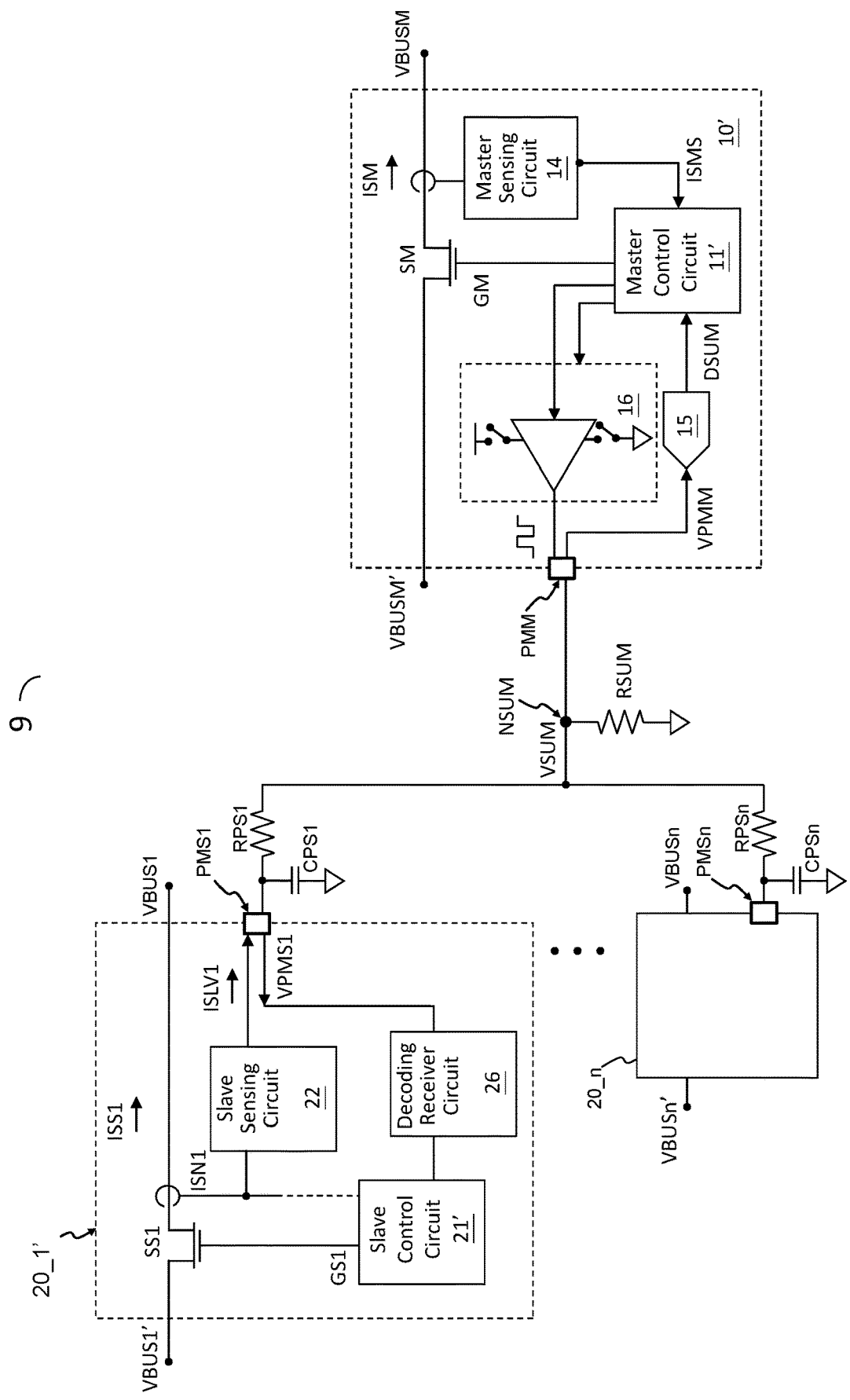
FIG. 9 shows a schematic block diagram of a power supply apparatus having multiple output ports according to another embodiment of the present invention.

Please still refer to FIG. 9. In one embodiment, the slave control circuit 21' is configured to operably adjust the slave output current ISS1 or the slave current limit level OCS1 of the slave power switch SS1 according to the digital adjustment command, so that the total power of the master output power and the slave output power does not exceed the predetermined power range.

From one perspective, in one embodiment, the master power management pin PMM, the slave power management pin PMS1 of the at least one slave power supply circuit (20_1 or 20_1') and the power management node NSUM together form only and solely one single-wire power management interface, for performing power management of the master power supply circuit (10 or 10') and the at least one slave power supply circuit (20_1 or 20_1'), to adjust the slave output power and/or adjust the master output power. The digital adjustment command complies with a single-wire communication protocol. The term "single-wire", as used herein, refers to the following: via only and solely one node (as shown by the power management node NSUM in FIG. 9), a bilateral communication (e.g., communication between one master power supply circuit and one slave power supply circuit) or a multilateral communication (e.g., communication among one master power supply circuit and plural slave power supply circuits), can be performed. The signal transmission by the single-wire communication can be conducted through various coding methods, to combine a data signal and a clock signal into one encoded signal; these methods are not the essence of the present invention and one skilled in this art can conceive various coding methods under the teachings by the present invention, so the details thereof are not redundantly explained here.

The present invention has been described in considerable detail with reference to certain preferred embodiments thereof. It should be understood that the description is for illustrative purpose, not for limiting the scope of the present invention. An embodiment or a claim of the present invention does not need to achieve all the objectives or advantages of the present invention. The title and abstract are provided for assisting searches but not for limiting the scope of the present invention. Those skilled in this art can readily conceive variations and modifications within the spirit of the present invention. For example, to perform an action "according to" a certain signal as described in the context of the present invention is not limited to performing an action strictly according to the signal itself, but can be performing an action according to a converted form or a scaled-up or down form of the signal, i.e., the signal can be processed by a voltage-to-current conversion, a current-to-voltage conversion, and/or a ratio conversion, etc. before an action is performed. It is not limited for each of the embodiments described herein before to be used alone; under the spirit of the present invention, two or more of the embodiments described hereinbefore can be used in combination. For example, two or more of the embodiments can be used together, or, a part of one embodiment can be used to replace a corresponding part of another embodiment. In view of the foregoing, the spirit of the present invention should cover all such and other modifications and variations, which should be interpreted to fall within the scope of the following claims and their equivalents.

What is claimed is:

1. A power supply apparatus having multiple output ports, comprising:
    a master power supply circuit, which is configured to operably supply a master output power via a master power switch;
    at least one slave power supply circuit, which is configured to operably supply a slave output power via a slave power switch; and
    a shared resistor coupled between a power management node and a reference ground level;
    wherein the master power supply circuit includes:
        a master power management pin coupled to the power management node;
        a master control circuit, which is configured to operably control the master power switch; and
        a current source adjustment circuit coupled to the master power management pin, wherein the current source adjustment circuit is controlled by the master control circuit;
    wherein the slave power supply circuit includes:
        a slave sensing circuit, which is configured to operably sense a slave output current of the slave output power and which is configured to operably generate a slave sensing current according to the slave output current;
        a slave power management pin coupled to the power management node; and
        a slave control circuit, which is configured to operably control the slave power switch;
    wherein the slave sensing circuit is configured to operably output the slave sensing current via the slave power management pin, so as to generate a total power signal at the power management node;
    wherein the master control circuit is configured to operably sense the total power signal via the master power management pin and is configured to operably determine an adjustment current according to the total power signal, and wherein the master control circuit is configured to operably control the current source adjustment circuit to output the adjustment current via the master power management pin; and
    wherein the slave control circuit is configured to operably sense a voltage at the slave power management pin and control the slave power switch according to the voltage at the slave power management pin, thereby adjusting the slave output power so that a total power of the master output power and the slave output power does not exceed a predetermined power range.

2. The power supply apparatus having multiple output ports of claim 1, further comprising:
    a master sensing circuit, which is configured to operably sense a master output current of the master output power and which is configured to operably generate a master sensing signal according to the master output current;
    wherein the master control circuit is further configured to operably determine the adjustment current according to the master sensing signal.

3. The power supply apparatus having multiple output ports of claim 2, wherein the master sensing circuit is further configured to operably sense a master output voltage of the master output power and is further configured to operably generate the master sensing signal according to a product of the master output current multiplied by the master output voltage.

4. The power supply apparatus having multiple output ports of claim 2, wherein the master control circuit is configured to operably adjust the master output current or a master current limit level of the master power switch according to the voltage at the master power management pin, so that the total power of the master output power and the slave output power does not exceed the predetermined power range.

5. The power supply apparatus having multiple output ports of claim 4, wherein:
    when the voltage at the master power management pin is greater than a first master voltage threshold, the master output current or the master current limit level is decreased; and/or when the voltage at the master power management pin is smaller than a second master voltage threshold, the master output current or the master current limit level is increased.

6. The power supply apparatus having multiple output ports of claim 1, wherein the master power supply circuit further includes:
an at-least-one-bit master analog to digital circuit (ADC), which is configured to operably convert the total power signal to generate an at-least-one-bit digital total signal representing the total power signal, wherein the generated at-least-one-bit digital total signal is supplied to the master control circuit.

7. The power supply apparatus having multiple output ports of claim 1, wherein the slave sensing circuit is further configured to operably sense a slave output voltage of the slave output power and is further configured to operably generate the slave sensing current according to a product of the slave output current multiplied by the slave output voltage.

8. The power supply apparatus having multiple output ports of claim 1, wherein:
the master control circuit includes a master state machine or a master microcontroller unit, the master state machine or the master microcontroller unit being configured to operably determine the adjustment current and control the current source adjustment circuit to output the adjustment current via the master power management pin; and/or
the slave control circuit includes a slave state machine or a slave microcontroller unit, the slave state machine or the slave microcontroller unit being configured to operably adjust the slave output power according to the voltage at the slave power management pin.

9. The power supply apparatus having multiple output ports of claim 1, wherein the adjustment current is a positive current or a negative current.

10. The power supply apparatus having multiple output ports of claim 1, further comprising at least one priority setting resistor, wherein the at least one priority setting resistor has one end coupled to the slave power management pin of a corresponding one of the at least one slave power supply circuit, and wherein the at least one priority setting resistor has another end coupled to the master power management pin;
wherein the at least one priority setting resistor is configured to operably set a relationship between the slave output power of the corresponding slave power supply circuit and the predetermined power range; or
wherein the at least one priority setting resistor is configured to operably set a relationship between the slave output power of the corresponding slave power supply circuit and a slave output power of another slave power supply circuit.

11. The power supply apparatus having multiple output ports of claim 1, wherein the slave control circuit is configured to operably adjust the slave output current or a slave current limit level of the slave power switch according to the voltage at the slave power management pin, so that the total power of the master output power and the slave output power does not exceed the predetermined power range.

12. The power supply apparatus having multiple output ports of claim 3, wherein:
when the voltage at the slave power management pin is greater than a first slave voltage threshold, the slave output current or the slave current limit level is decreased; and/or
when the voltage at the slave power management pin is smaller than a second slave voltage threshold, the slave output current or the slave current limit level is increased.

13. The power supply apparatus having multiple output ports of claim 12, wherein under a situation where the slave output current or the slave current limit level of the slave power switch has already been decreased to a minimum slave limit level, when the voltage at the slave power management pin is greater than the first slave voltage threshold, the slave power switch is turned OFF.

14. The power supply apparatus having multiple output ports of claim 12, wherein under a situation where the master output current or the master current limit level of the master power switch has already been decreased to a minimum master limit level, when the voltage at the master power management pin is greater than the first master voltage threshold, the master power switch is turned OFF.

15. The power supply apparatus having multiple output ports of claim 1, further comprising at least one priority setting capacitor, which is coupled to the slave power management pin of a corresponding one of the at least one slave power supply circuit;
wherein the at least one priority setting capacitor is configured to operably set a relationship between the slave output power of the corresponding slave power supply circuit and the predetermined power range; or
wherein the at least one priority setting capacitor is configured to operably set a relationship between the slave output power of the corresponding slave power supply circuit and a slave output power of another slave power supply circuit.

16. The power supply apparatus having multiple output ports of claim 1, wherein when the slave sensing current is greater than a first slave current threshold and when the voltage at the slave power management pin is smaller than a third slave voltage threshold, the shared resistor is determined to be short-circuited and the slave power switch is turned OFF.

17. The power supply apparatus having multiple output ports of claim 1, wherein the master power management pin, the slave power management pin of the at least one slave power supply circuit and the power management node together form only and solely one single-wire power management interface, wherein the single-wire power management interface is configured to operably perform power management of the master power supply circuit and the at least one slave power supply circuit, to adjust the slave output power and/or adjust the master output power.

18. A power supply apparatus having multiple output ports, comprising:
a master power supply circuit, which is configured to operably supply a master output power via a master power switch;
at least one slave power supply circuit, which is configured to operably supply a slave output power via a slave power switch; and
a shared resistor coupled between a power management node and a reference ground level;
wherein the master power supply circuit includes:
a master power management pin coupled to the power management node;
a master control circuit, which is configured to operably control the master power switch; and a communication driver circuit coupled to the master power management pin, wherein the communication driver circuit is controlled by the master control circuit;

wherein the slave power supply circuit includes:
a slave sensing circuit, which is configured to operably sense a slave output current of the slave output power and which is configured to operably generate a slave sensing current according to the slave output current;
a slave power management pin coupled to the power management node; and
a slave control circuit, which is configured to operably control the slave power switch;

wherein the slave sensing circuit is configured to operably output the slave sensing current via the slave power management pin, so as to generate a total power signal at the power management node;

wherein the master control circuit is configured to operably sense the total power signal via the master power management pin and is configured to operably control the communication driver circuit to output a digital adjustment command via the master power management pin according to the total power signal; and wherein the slave control circuit is configured to operably receive the digital adjustment command via the slave power management pin, and wherein the slave control circuit is configured to operably control the slave power switch according to the digital adjustment command, to adjust the slave output power, so that a total power of the master output power and the slave output power does not exceed a predetermined power range.

19. The power supply apparatus having multiple output ports of claim 18, wherein the slave control circuit is configured to operably adjust the slave output current or a slave current limit level of the slave power switch according to the digital adjustment command, so that the total power of the master output power and the slave output power does not exceed the predetermined power range.

20. The power supply apparatus having multiple output ports of claim 18, wherein the master power management pin, the slave power management pin of the at least one slave power supply circuit and the power management node together form only and solely one single-wire power management interface, wherein the single-wire power management interface is configured to operably perform power management of the master power supply circuit and the at least one slave power supply circuit, to adjust the slave output power and/or adjust the master output power;

wherein the digital adjustment command complies with a single-wire communication protocol of the single-wire power management interface.

21. The power supply apparatus having multiple output ports of claim 18, wherein under a situation where the communication driver circuit does not transmit the digital adjustment command, the communication driver circuit is disconnected from the master power management pin or is floating with respect to the master power management pin.

22. The power supply apparatus having multiple output ports of claim 18, wherein the at least one slave power supply circuit further includes a decoder circuit, which is configured to operably receive a voltage at the slave power management pin and decode the digital adjustment command.

23. A master power supply circuit for use in a power supply apparatus having multiple output ports, wherein the power supply apparatus having multiple output ports includes: at least one slave power supply circuit, which is configured to operably supply a slave output power via a slave power switch; and a shared resistor coupled between a power management node and a reference ground level; wherein the slave sensing circuit is configured to operably output a slave sensing current via a slave power management pin coupled to the power management node, to generate a total power signal at the power management node, and is configured to operably sense a voltage at the slave power management pin, and adjust the slave output power according to the voltage at the slave power management pin; wherein the master power supply circuit is configured to operably supply a master output power via a master power switch; the master power supply circuit comprising:
a master power management pin coupled to the power management node;
a master control circuit, which is configured to operably control the master power switch; and
a current source adjustment circuit coupled to the master power management pin, wherein the current source adjustment circuit is controlled by the master control circuit;
wherein the master control circuit is configured to operably sense the total power signal via the master power management pin and is configured to operably determine an adjustment current according to the total power signal, and wherein the master control circuit is configured to operably control the current source adjustment circuit to output the adjustment current via the master power management pin.

24. The master power supply circuit of claim 23, further including:
a master sensing circuit, which is configured to operably sense a master output current of the master output power and which is configured to operably generate a master sensing signal according to the master output current;
wherein the master control circuit is further configured to operably determine the adjustment current according to the master sensing signal.

25. The master power supply circuit of claim 24, wherein the master sensing circuit is further configured to operably sense a master output voltage of the master output power and is further configured to operably generate the master sensing signal according to a product of the master output current multiplied by the master output voltage.

26. The master power supply circuit of claim 23, wherein the master power supply circuit further includes:
an at-least-one-bit master analog to digital circuit (ADC), which is configured to operably convert the total power signal to generate an at-least-one-bit digital total signal representing the total power signal, wherein the generated at-least-one-bit digital total signal is supplied to the master control circuit.

27. The master power supply circuit of claim 23, wherein the master control circuit is configured to operably adjust the master output current or a master current limit level of the master power switch according to the voltage at the master power management pin, so that the total power of the master output power and the slave output power does not exceed the predetermined power range.

28. The master power supply circuit of claim 23, wherein the adjustment current is a positive current or a negative current.

29. A slave power supply circuit for use in a power supply apparatus having multiple output ports, wherein the power supply apparatus having multiple output ports includes: a master power supply circuit, which is configured to operably supply a master output power via a master power switch; and a shared resistor coupled between a power management node and a reference ground level; wherein the master power supply circuit is configured to operably determine an adjustment current and output the adjustment current via a master power management pin coupled to the power management node; a master control circuit; wherein the slave power supply circuit is configured to operably supply a slave output power via a slave power switch; the slave power supply circuit comprising:
  a slave sensing circuit, which is configured to operably sense a slave output current of the slave output power and which is configured to operably generate a slave sensing current according to the slave output current;
  a slave power management pin coupled to the power management node; and
  a slave control circuit, which is configured to operably control the slave power switch;
  wherein the slave sensing circuit is configured to operably output the slave sensing current via the slave power management pin, so as to generate a total power signal at the power management node, wherein the total power signal is sensed by the master power supply circuit for determining the adjustment current; and
  wherein the slave control circuit is configured to operably sense a voltage at the slave power management pin, to control the slave power switch, thereby adjusting the slave output power, so that a total power of the master output power and the slave output power does not exceed a predetermined power range.

30. The slave power supply circuit of claim 29, wherein the slave control circuit is configured to operably adjust the slave output current or a slave current limit level of the slave power switch according to the voltage at the slave power management pin, so that the total power of the master output power and the slave output power does not exceed the predetermined power range.

31. The slave power supply circuit of claim 29, wherein the slave sensing circuit is further configured to operably sense a slave output voltage of the slave output power and is further configured to operably generate the slave sensing current according to a product of the slave output current multiplied by the slave output voltage.

32. A control method for controlling a power supply apparatus having multiple output ports, wherein the power supply apparatus having multiple output ports includes: a master power supply circuit, which is configured to operably supply a master output power via a master power switch; at least one slave power supply circuit, which is configured to operably supply a slave output power via a slave power switch; and a shared resistor coupled between a power management node and a reference ground level; wherein the master power supply circuit includes a master power management pin coupled to the power management node; wherein the slave power supply circuit includes a slave power management pin coupled to the power management node; the control method comprising:
  sensing a slave output current of the slave output power and generating a slave sensing current according to the slave output current;
  outputting the slave sensing current via the slave power management pin, so as to generate a total power signal at the power management node;
  determining an adjustment current according to the total power signal and outputting the adjustment current via the master power management pin; and
  controlling the slave power switch according to a voltage at the slave power management pin, so as to adjust the slave output power, and/or adjusting the master output current or a master current limit level of the master power switch according to the voltage at the master power management pin, so that a total power of the master output power and the slave output power does not exceed a predetermined power range.

33. The control method of claim 32, wherein the step for adjusting the slave output power includes:
  when the voltage at the slave power management pin is greater than a first slave voltage threshold, decreasing the slave output current or the slave current limit level; and/or
  when the voltage at the slave power management pin is smaller than a second slave voltage threshold, increasing the slave output current or the slave current limit level.

34. The control method of claim 33, wherein the step for adjusting the slave output power further includes:
  under a situation where the slave current limit level has already been decreased to a minimum slave limit level, when the voltage at the slave power management pin is greater than the first slave voltage threshold, turning OFF the slave power switch.

35. The control method of claim 34, wherein the step for adjusting the slave output power further includes:
  under a situation where the slave power switch is OFF, when the voltage at the slave power management pin is smaller than the second slave voltage threshold, turning ON the slave power switch and increasing the slave current limit level of the slave power switch.

36. The control method of claim 32, further comprising:
  when the slave sensing current is greater than a first slave current threshold and when the voltage at the slave power management pin is smaller than a third slave voltage threshold, determining the shared resistor is short-circuited and turning OFF the slave power switch.

37. The control method of claim 32, wherein the step for adjusting the master current limit level of the master power switch includes:
  when the voltage at the master power management pin is greater than a first master voltage threshold, decreasing the master output current or the master current limit level; and/or
  when the voltage at the master power management pin is smaller than a second master voltage threshold, increasing the master output current or the master current limit level.

38. The control method of claim 37, wherein the step for adjusting the master current limit level of the master power switch further includes:
  under a situation where the master current limit level has already been decreased to a minimum master limit level, when the voltage at the master power management pin is greater than the first master voltage threshold, turning OFF the master power switch.

39. The control method of claim 38, wherein the step for adjusting the master current limit level of the master power switch further includes:
  under a situation where the master power switch is OFF, when the voltage at the master power management pin is smaller than the second master voltage threshold, turning ON the master power switch and increasing the master current limit level of the master power switch.

\* \* \* \* \*